United States Patent [19]

Bird

[11] Patent Number: 4,866,368
[45] Date of Patent: Sep. 12, 1989

[54] CIRCUIT ARRANGEMENT FOR STORING SAMPLED ANALOGUE ELECTRICAL CURRENTS

[75] Inventor: Neil C. Bird, Eindhoven, Netherlands

[73] Assignee: U.S. Philips Corporation, New York, N.Y.

[21] Appl. No.: 244,439

[22] Filed: Sep. 14, 1988

[30] Foreign Application Priority Data

Sep. 16, 1987 [GB] United Kingdom ............... 8721759

[51] Int. Cl.$^4$ ............................................. G05F 3/24
[52] U.S. Cl. ..................................... 323/316; 323/317; 307/353; 307/296.5
[58] Field of Search ............... 323/311, 312, 315, 316, 323/317; 307/352, 353, 238.1, 238.8

[56] References Cited

U.S. PATENT DOCUMENTS

| | | | |
|---|---|---|---|
| 4,323,796 | 4/1982 | Lathrope | 323/316 |
| 4,458,200 | 7/1984 | Geller | 323/316 |
| 4,583,037 | 4/1986 | Sooch | 323/315 |
| 4,585,951 | 4/1986 | Wurzburg | 307/353 |
| 4,604,584 | 8/1986 | Kelley | 307/353 |
| 4,694,341 | 9/1987 | Soneda et al. | 307/353 |
| 4,703,249 | 10/1987 | De La Plaza et al. | 323/316 |

Primary Examiner—Peter S. Wong
Attorney, Agent, or Firm—Bernard Franzblau

[57] ABSTRACT

An analogue current memory has a current input (1) which is connected to the input branch of a first current mirror circuit formed by two transistors (T4 and T8). The input and output branches of the first current mirror are isolated by a first switch (S1) which is controlled by a clock signal φA. The output branch of the first current mirror is connected to the input branch of a second current mirror formed by two transistors (T9 and T12). The input and output branches of the second current mirror are isolated by a second switch (S2) which is controlled by a clock signal φB which does not overlap the clock signal φA. The first switch is closed during the first half of the sample period and the second switch is closed during the second half. A current fed to input 1 is mirrored by the transistor T8 while the first switch (S1) is closed and a first capacitor (CA) charges to the gate/source voltage of transistor T8. When the first switch opens the current through transistor T8 is maintained by the charge on the first capacitor. When the second switch (S2) closes the current supplied by transistor (T9) is mirrored onto transistor (T12) and hence to the output (6). When the second switch (S2) opens the current through transistor (T12) is maintained by the charge on a second capacitor (CB). Thus the output is valid when the second switch is open, i.e. during the period φA of the next sample period.

10 Claims, 5 Drawing Sheets

CIRCUIT ARRANGEMENT FOR STORING SAMPLED ANALOGUE ELECTRICAL CURRENTS

BACKGROUND OF THE INVENTION

This invention relates to a circuit arrangement for storing sampled analogue electrical currents.

The switched capacitor technique has been used for processing analogue signals using circuitry which can be easily integrated. It is difficult to integrate large valued resistors because of the area occupied thereby and further the correlation between resistor and capacitor values produced by integration is not good, causing the resultant time constants to be poorly defined. Therefore, the technique of using the equivalent resistance of a capacitor which is switched into and out of circuit to cause processing to take place by means of manipulation of charge packets has been used for analogue signal processing where integration has been required.

Although they are widely used, switched capacitor circuits have certain disadvantages. It is necessary to produce capacitors which are linear, that is their capacitance should not change significantly with the signal level. This has been achieved in CMOS integrated circuits by providing two polysilicon layers for the plates of the capacitors. However, standard CMOS processes used for the integration of digital circuits do not employ a double polysilicon layer. Consequently, switched capacitor circuits which are formed on the same chip as digital circuits require additional processing steps. In switched capacitor circuits the double polysilicon layer switched capacitors together with the required compensation capacitors for the operational amplifiers can account for a significant proportion of the total silicon area. This tends to produce relatively large chips. Further, in most switched capacitor systems, each amplifier and switch must be individually designed and optimised for its particular environment in order for the circuit to perform adequately.

My co-pending application No. 8721758, which corresponds to copending U.S. Appln. Ser. No. 244,440, filed Sept. 14, 1988, discloses a method of processing sampled analogue electrical signals comprising the steps of (a) converting each sample into a current, if it is not already in that form;

(b) combining, in predetermined proportions, the input sample current in the present sample period with current(s) derived from input sample current(s) in one or more preceding sample periods, and (c) deriving the processed output signal from the combined current produced by step (b) in successive sample periods.

This method is based on the realisation that the quantity manipulated can be current rather than, as is the case with switched capacitor circuits, charge. The choice of current as the manipulated variable quantity rather than charge characterises the method. Thus, in a switched capacitor circuit the signal processing is achieved by adding, subtracting or storing electrical charges, whereas in the method set out hereinbefore, referred to hereinafter as switched current signal processing, the signal processing is achieved by scaling, adding, subtracting or storing electrical current samples. Considerable similarities exist in the processing of the electrical quantities although the actual electrical quantity manipulated is different. In particular, all of the mathematics concerned with the application of Z-transforms to switched capacitor circuits is equally valid for those employing current as the manipulated quantity.

The choice of current as the manipulated quantity provides a number of advantages. The technique does not require high quality linear capacitors. As a direct consequence, it may be possible to dispense with the second polysilicon layer used in switched capacitor circuits to fabricate linear capacitors. In that case standard CMOS processes used for the integration of digital circuits may be used for the implementation of circuits employing the method. This gives true VLSI compatibility. Since the large area double polysilicon layer switched capacitors are not required and the only requirement for capacitors for the new method is for capacitors which have a small value and have a monotonic charge/voltage relationship which need not be linear and which may be realised as gate oxide or diffusion capacitors. Thus, for a given function the implementation will be smaller than its switched capacitor counterpart. Further reduction in the chip area may also result from the use of smaller geometry MOS processes. Circuits designed in older, coarser, processes may be able to take advantage of developments in mask making and etching technologies by geometric shrinkage of the layout. Geometric shrinkage is not generally feasible in switched capacitor circuits since circuit parameters, such as amplifier settling time and switch resistance, can change detrimentally even though the channel width/length ratio of the MOS devices is held constant.

In a switched capacitor system, each amplifier and switch must be individually designed and optimized for its particular environment in order for the circuit to perform adequately. In contrast, the nature of operation of the switched current signal processing method requires only two basic circuit elements, that is a family of low input impedance high output impedance current mirrors and analogue current memory, which need be designed once only for each IC process. It will, of course, be necessary to design a separate current mirror for each scaling factor. Thus, once a particular system configuration has been decided upon, the time spent on circuit design for implementation of the new technique may be significantly reduced compared with that required for a switched capacitor approach. The independent cellular nature of the circuitry enabled by the switched current signal processing method opens the way for semi-custom design procedures to be applied.

The principal disadvantage of this method is a consequence of its discrete time operation. As in a switched capacitor signal processing system or any system in which signal sampling is performed, some form of anti-aliasing filtering is required before the first sample and hold operation. Apart from representing an increase in complexity of total circuit function, the VLSI compatibility of the technique is threatened if the anti-alias filter requires a second polysilicon layer or other process modification for its monolithic implementation.

SUMMARY OF THE INVENTION

In order to implement the method disclosed in may co-pending application No. 8721758 (PHB33385) a circuit arrangement for storing a sampled analogue current is required and consequently it is an object of the invention to provide such a circuit arrangement.

The invention provides a circuit arrangement for storing sampled analogue electrical currents comprising a current input, a current output, first and second switches controlled by first and second non-overlapping clock signals, and first and second storage cells, wherein the current input is coupled to the first storage cell by means of the first switch and the first storage cell is coupled to the second storage cell by means of the second switch, the output of the second storage cell being coupled to the current output.

The output of the arrangement can be considered valid whenever the second switch is open. Clearly, the output current may have a changing value when the second switch is closed as it will take a finite time for the current in the second storage cell to settle where there is a difference in currents in successive sampling periods.

Each storage cell may comprise a field effect transistor having a capacitor connected between its gate and source electrodes. Thus, provided that the sampling frequency is sufficiently high, the gate-source voltage of the transistors will be held constant by the charge on the capacitor and so maintain the output current constant.

In each storage cell the field effect transistor may form an output branch of a current mirror circuit. The first and second switches may be arranged to isolate the input and output branches of the current mirrors, the output branch of the first current mirror being connected to the input branch of the second current mirror.

The provision of the switches between the current branches of the current mirrors enables the isolation of the two branches while providing a current path for the output of the first storage cell when the second switch is open.

At least one of the current mirror circuits may have a non-unity current ratio between its input and output branches. The second current mirror may have a plurality of output branches.

This enables the arrangement to have a current gain which differs from unity and to have a fan-out capability to enable various circuit functions to be implemented.

BRIEF DESCRIPTION OF THE DRAWINGS

An embodiment of the invention will now be described, by way of example, with reference to the accompanying drawings, in which.

DESCRIPTION OF THE PREFERRED EMBODIMENTS

Figure 1:
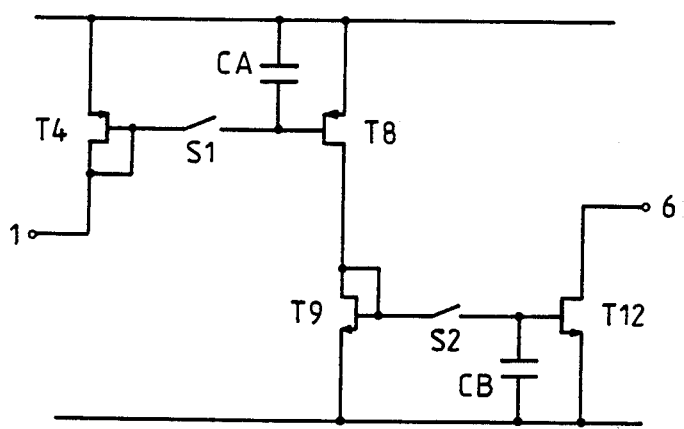
FIG. 1 is a circuit diagram of an embodiment of a circuit arrangement according to the invention for storing sampled analogue signals.
Figure 2:
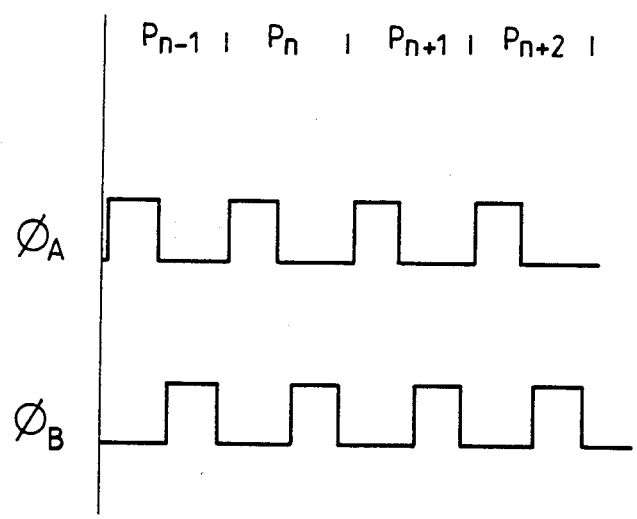
FIG. 2 shows clock signals for controlling the switches in the embodiment of FIG. 1.

The circuit arrangement shown in FIG. 1 has a current input 1 which is connected to the input branch of a first current mirror circuit formed by two p-channel field effect transistors (FETs) T4 and T8. The gate electrodes of FETs T4 and T8 are coupled by a switch S1 controlled by a clock signal $\phi_A$ which is shown in FIG. 2. A capacitor CA is connected between the gate and source electrodes of FET T8 and is isolated from the gate of FET T4 by the switch S1. The depth of FET T8, which forms the output branch of the first current mirror circuit, is connected to the drain electrode of an n-channel FET T9 which forms the input branch of a second current mirror circuit whose output branch is formed by an n-channel FET T12 whose drain electrode is connected to the current output 6. The gate electrodes of FETs T9 and T12 are coupled by a switch S2 controlled by a clock signal $\phi_B$ which is shown in FIG. 2. A capacitor CB is connected between the gate and source electrodes of FET T12 and is isolated from the gate of FET T9 by the switch S2.

In operation an input current sample is fed to input 1 during sample period $P_n$ and during clock $\phi_A$ switch S1 is closed and hence the input current applied to the drain of FET T4 is mirrored at the drain of FET T8. At the same time the capacitor CA becomes charged to the gate/source voltage of FET T8. At the end of the period $\phi_A$ in the sample period $P_n$ the switch S1 opens but the current through FET T8 is maintained due to the charge on capacitor CA. When the non-overlapping clock signal $\phi_B$ occurs during sample period $P_n$ the switch S2 is closed and the drain current of FET T12 mirrors that of the FET T9. At the same time the capacitor CB is charged to the gate/source potential of FET T12. At the end of the period $\phi_B$ in the sample period $P_n$ the switch S2 opens but the current through FET T12 is maintained due to the charge on capacitor CB. Thus, from the end of the clock period $\phi_B$ in sample period $P_n$ until the beginning of the clock period $\phi_B$ in sample period $P_{n+1}$ the output current provided by the circuit arrangement is equal to the input current during the clock period $\phi_A$ in sample period $P_n$.

Thus if we define the true state of the current to be that during each $\phi_A$ clock in each sample period then the relationship between the input $I_i$ and output $I_o$ currents can be written $$I_o(n) = I_i(n-1)$$

Clearly an input current could be stored for more than one sample period by cascading the circuit arrangement shown in FIG. 1. Alternatively, if a new input sample is not to be applied in every sample period then an appropriate choice of clock signal waveforms $\phi_A$ and $\phi_B$ could provide a greater than one sample period storage. Further by selective feedback of the output current to the input greater than one sample period storage could be achieved. That is a recirculating memory may be formed by connecting the output 6 to the input 1.

The circuit arrangement shown in FIG. 1 can be used to provide a one sample period delay of the input current or to provide a multiple sample period delay by cascading a plurality of such arrangements. A less than one sample period delay could be achieved by providing a second output branch on the current mirror formed by FETs T4 and T8 and appropriately clocking the second output branch, for example using clock $\phi_B$.

If it is desired to make the input and output current equal then both current mirrors can have a unity current ratio or they could have non-unity but complementary current ratios. If the desired output current is to be a multiple or submultiple of the input current then this can be achieved by appropriate choice of the current ratios of the current mirrors.

The choice of current ratios can be achieved in conventional fashion by the choice of the dimensions of the FETs or the choice of source degeneration resistor values.

Figure 3:
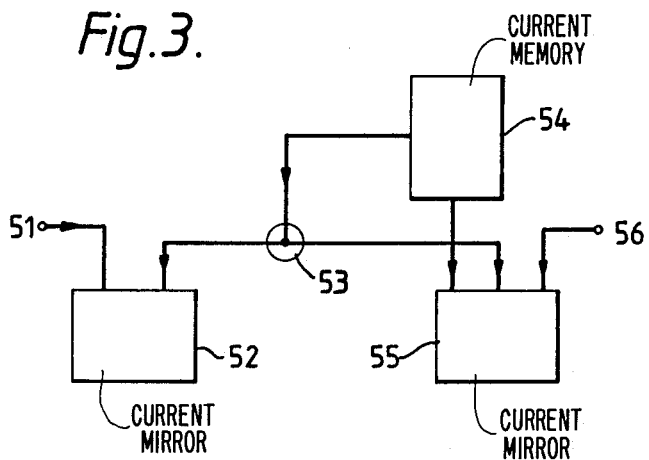
FIG. 3 shows in block schematic form an integrator in which a circuit arrangement according to the invention is incorporated.
Figure 4:
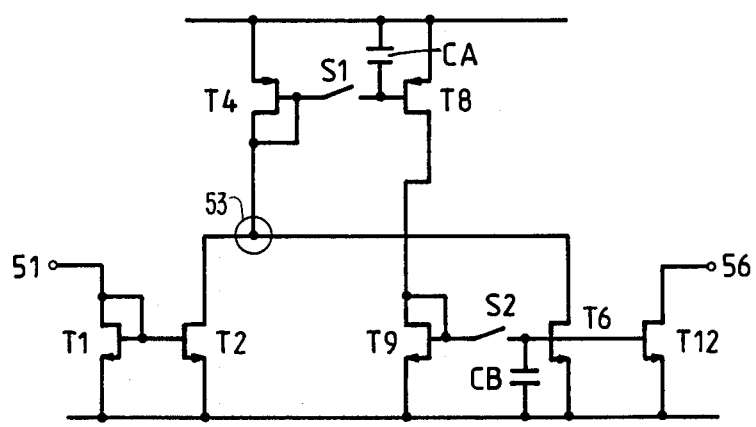
FIG. 4 is a first transistor level embodiment of the integrator shown in FIG. 3.
Figure 5:
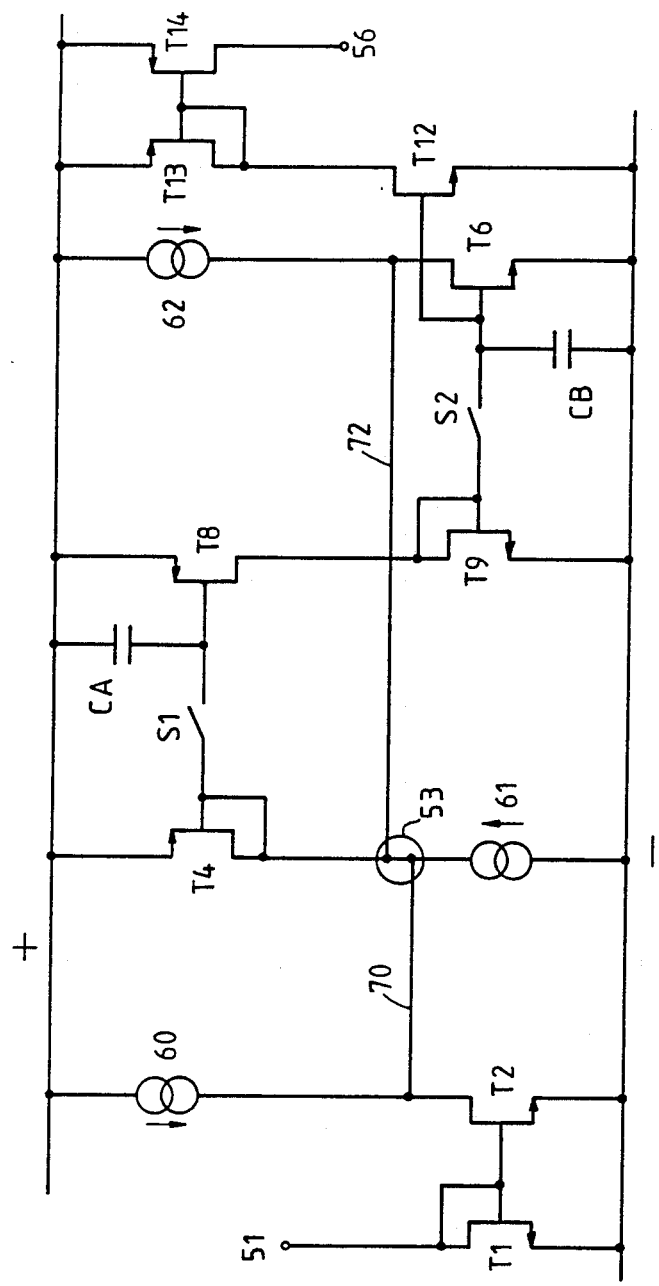
FIG. 5 is a second transistor level embodiment of the integrator shown in FIG. 3 having provision for signals of both positive and negative polarity.

FIG. 3 shows an integrator comprising a circuit arrangement as shown in FIG. 1 which in the subsequent description with reference to FIGS. 3 to 5 will be referred to as a current memory 54, a first current mirror circuit 52, a second current mirror circuit 55 and a summing node 53. The integrator has an input 51 for receiving an input signal in the form of a sampled current and an output 56 at which the integrated input becomes available.

In operation, current samples are fed to the input 51 and the input current sample is reproduced at the output of the current mirror 52. Assuming that the integrator is reset to zero, when the first current pulse occurs it is stored in the current memory 54. The input current sample applied to the input 51 in the next sample period will then be summed with the current at the output of the current mirror 55. The current at the output of the current mirror 55 will be that stored in the current memory 54 during the previous sample period. The summed current at the summing node 53 is then fed to the input of current memory 54. Thus during the first sample period the output of the integrator will be at zero. During the second sample period, the output of the current memory 54 will be equal to the current applied during the first sample period and hence the output of the integrator will also be equal to the current applied during the first sample period. Also, during the second sample period the input of the current memory 54 will receive the sum of the current during the second sampling period and the current during the first sampling period derived from the output of the current memory 54 and hence during the third sampling period the output of the integrator, which is assumed equal to the output of the current memory 54, will be equal to the current during the first sampling period plus the current during the second sampling period. Thus this arrangement will continuously add the sample currents in successive sample periods and produce at the output the sum of the currents in each of the sampling periods that have occurred since the integrator was reset. This assumes that the gains of both current mirrors 52 and 55 are equal to one. Clearly this is not necessarily the case and the gains can be chosen to give a desired characteristic to the integrator. For example, a lossy integrator can be provided if the gain of the current mirror 55 is to be less than one. If it is assumed that the gain of the current mirror 52 is equal to $\alpha$ and the gain of the current mirror 55 is equal to $\beta$ and that n sampling periods have elapsed since the integrator was set to zero, then the current output of the integrator during the nth period $$I_{OUT}(n) = \beta \times I_{OUT}(n-1) + \alpha I_{IN}(n-1).$$

Figure 6:
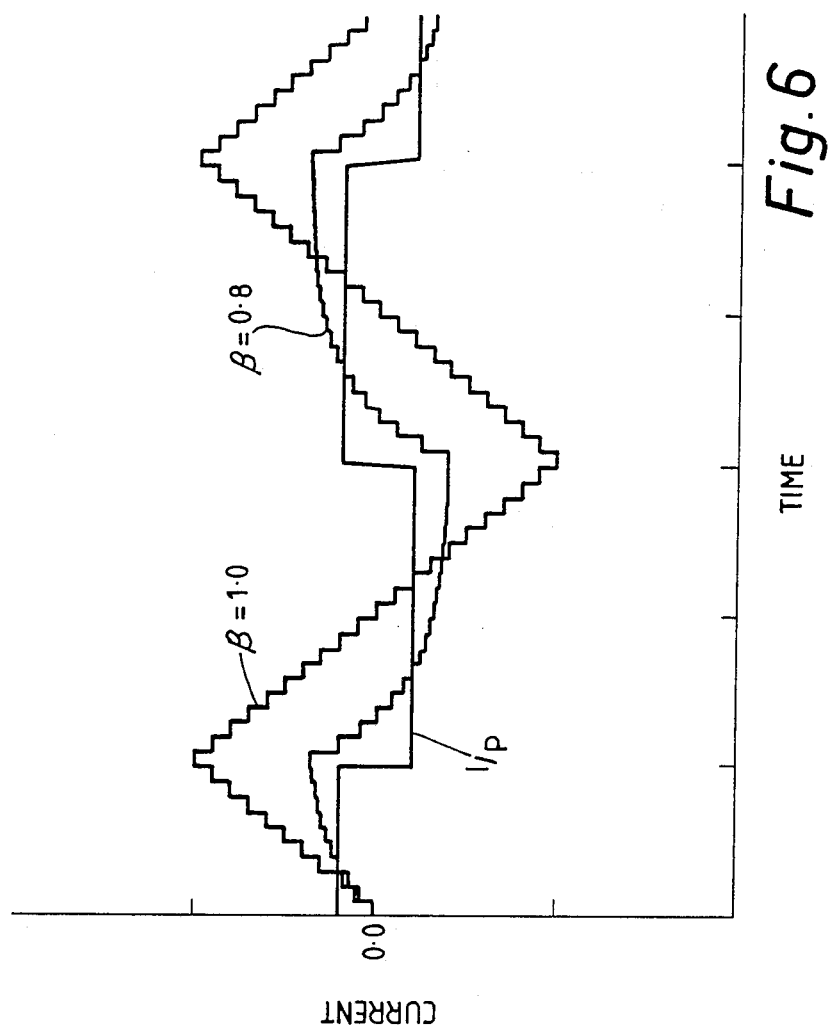
FIG. 6 shows curves illustrating the response of the integrator shown in FIG. 5, and, FIG. 7 shows an embodiment of a current mirror suitable for use in the integrator shown in FIGS. 3, 4 or 5.

FIG. 6 shows the response of the integrator shown in FIG. 3 where $\alpha$ is set to 0.5 and in the first case $\beta$ is set to 1 and in the second case $\beta$ is set to 0.8. The first case illustrates an ideal integrator and the second a lossy integrator.

FIG. 4 is a transistor level circuit diagram of an integrator of the form shown in FIG. 3. As shown in FIG. 4 the current mirror 52 is formed from two field effect transistors (FETs) T1 and T2. The output of the current mirror 52, which is formed by the drain of transistor T2, is connected to the summing junction 53. The source of transistor T4 is the input of the current memory 54. The current memory comprises the transistors T4, T8, T6, and T9; the capacitors CA and CB; and two switches S1 and S2. The switches S1 and S2 are operated by pulses $\phi_A$ and $\phi_B$ from a clock generator (not shown). These pulses are non-overlapping and occur at the sampling rate, that is there is a $\phi_A$ and a $\phi_B$ pulse in each sample period. Assuming that the integrator is reset, the input signal current applied in one sampling period to the input 51 is mirrored at the output of transistor T2 and applied to the summing junction 53 and hence to the input of the current memory 54. During a first portion $\phi_A$ of the sample period, the switch S1 is closed and hence the transistor T8 will mirror the current applied to the transistor T4. At the same time the capacitor CA will charge to the gate source potential of the transistor T8 and also of the transistor T4. When the switch S1 is opened at the end of the first portion $\phi_A$ the charge on the capacitor CA maintains the gate/source potential of transistor T8 and hence the current flowing through it. During a second non-overlapping portion $\phi_B$ of the sample period, the switch S2 is closed and the transistors T9 and T6 then form a current mirror, transistor T9 being the input branch and transistor T6 the output branch. During the period $\phi_B$ when the switch S2 is closed, the output current produced by transistor T6 mirrors the input current applied to transistor T9 and at the same time the capacitor CB is charged to the gate-source potential of the transistor T6. Consequently, when the switch S2 opens, the current through transistor T6 is maintained by the voltage stored on the capacitor CB. Thus the output for period (n−1) is held on transistor T6 until the period $\phi_B$ in the sampling period n. The gate-source potential of transistor T12 is also determined by the charge on capacitor CB and the output current of the integrator is derived from the current through transistor T12. This will be proportional to the current through transistor T6, The constant of proportionality depending on the dimensions of transistors T6 and T12.

In the embodiment shown in FIG. 4, the current mirror 52 is formed by transistors T1 and T2; the current memory 54 is formed by transistors T4, T8, T6, T9, capacitors CA and CB, and switches S1 and S2; and the current mirror 55 is formed by the capacitor CB and transistors T6 and T12. During the period $\phi_B$ the transistor T9 also forms a part of the current mirror 55.

The circuit shown in FIG. 4 is suitable only for currents which are uni-directional. In order to cater for signals which have positive and negative values with respect to a reference and thus give rise to bi-directional input currents, the input current is added to a bias current $I_{bias}$ which allows the input current to have a peak to peak range of $\pm I_{bias}$, assuming that the circuits are designed to handle a peak current of $2I_{bias}$, while presenting a unidirectional current to the input 51. The arrangement shown in FIG. 5 is similar to that shown in FIG. 4 but is provided with additional sources of bias current to enable a bi-directional input current superimposed on a bias current to be processed and an output to be produced having a similar form, i.e. a bi-directional signal current superimposed on the bias current $I_{bias}$. In FIG. 5, those components having the same function as components in FIG. 4 have been given the same reference symbols.

The circuit shown in FIG. 5 has a current source 60 connected between the drain of transistor T2 and the positive supply rail. The current source 60 provides a current $\alpha I_{bias}$, where $\alpha$ is the gain of the current mirror comprising transistors T1 and T2. Consequently if an input current $I_{bias}+i$ is applied to input 51 a current $\alpha i = \alpha(I_{bias}+i) - \alpha I_{bias}$ is fed to the summing junction 53 over line 70. A further current source 61 is connected between the negative supply rail and the summing junction 53. Since the current $\alpha i$ is bi-directional it is necessary to superimpose it on a bias current to prevent the diode connected transistor T4 at the input of the current memory from being reverse biassed. The current source 61 is arranged to produce a current $I_{bias}$ which is added to the current $\alpha i$ on the line 70. The current memory 54 comprises first and second switched current mirrors formed by transistors T4 and T8 and T9 and T6, respectively. The second current mirror formed by transistors T9 and T6 also form the current mirror 55 and is arranged so that transistor T6 produces the current $\beta I_{mem}$ and that transistor T12 produces the current $I_{mem}$. The current $I_{mem}$ is equal to $i_o + I_{bias}$ where $i_o$ is the integrated input current.

Since the current $I_{mem}$ includes the bias current and hence the current $\beta I_{mem}$ includes $\beta I_{bias}$ it is necessary to subtract the current $\beta I_{bias}$ from the current produced by transistor T6 and fed back over line 72 to the summing junction 53 to prevent the bias current from being integrated as well as the signal current. Consequently a current source 62 is connected between the positive supply rail and the drain of transistor T6, the current source 62 being arranged to produce the current $\beta I_{bias}$ which is subtracted from the current produced by transistor T6.

It should be noted that the current ratio between transistors T9 and T12 is 1:1 and hence the current produced by transistor T12 is equal to $I_{mem}$ and consequently is $i_o + I_{bias}$. The current mirror formed by transistors T13 and T14 is arranged to have a 1:1 current ratio and is provided merely to invert the direction of the output current to match that of the input current. Its presence is optional depending on the function required and consequently the output current may be taken from the drain of transistor T12 if inversion of the output current with respect to the input is required.

For best performance, the current mirrors 52 and 55 should have a high output impedance. For the sake of simplicity in the drawings, the current mirrors have been shown as a simple transistor pair. However, cascoded connection of transistors in the current mirror may be used to increase the output impedance of the current mirrors. Two such current mirrors have been disclosed in U.S. Pat. Nos. 4550284 and 4583037. A further cascoded current mirror which could be used in the arrangements shown in FIGS. 3, 4 or 5 is shown in FIG. 7.

Figure 7:
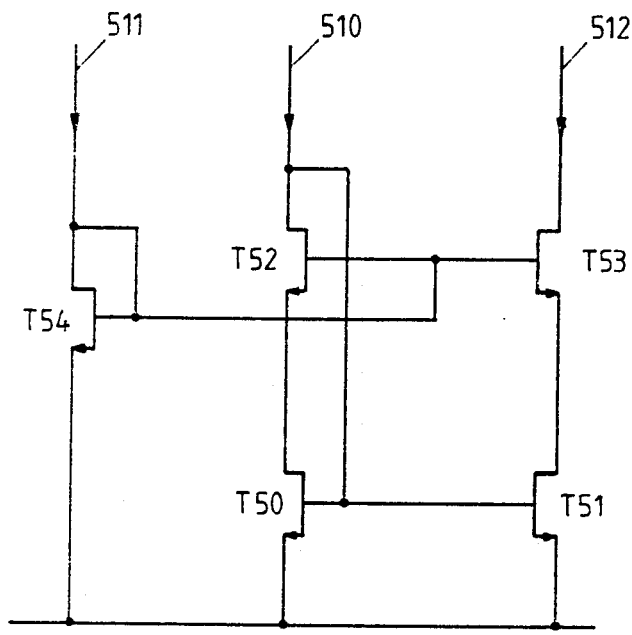

The current mirror circuit shown in FIG. 7 has an input on line 510. The current mirror is formed by two cascoded transistors T50 and T52 in the input branch and two further cascoded transistors T51 and T53 in the output branch, the output being derived from line 512.

A further branch comprising a transistor T54 and having an input on line 511 is provided to produce a bias current for the transistors T52 and T53. The transistor T54 has a gate width to length ratio of a quarter of that of the transistors T52 and T53. It is possible to extend the cascoding of the transistors in the branches of the current mirror. A third cascoded transistor may be connected, in which case a further bias branch is required to bias the third transistors in the input and output branches. The transistor in the further bias branch having a gate width to length ratio of 1/9th of that of the third transistors. These biassing arrangements give a maximum dynamic range for the input signals to the current mirror. If a maximum dynamic range is not required the cascoded transistors may be fed from a fixed bias potential. A further modification which may be made to the current mirrors to improve their performance is dynamic element matching by means of which the input and output branches are continuously interchanged at a given clocking rate and an average output current derived. This technique may be used to compensate for mismatching in the transistors between the two branches of the current mirror. Dynamic element matching has been described in an article entitled "Dynamic Element Matching puts Trimless Converters on Chip" by Rudy van de Plassche in "Electronics" dated June 16, 1983.

The invention has been described for application to both an ideal and a lossy integrator, however, the field of application of the invention extends beyond this particular type of circuit. For example, any signal processing circuit which can be fabricated by means of switched capacitor techniques will have an equivalent arrangement using the technique according to the invention which is referred to herein as the switched current technique. Thus the manipulation of charges in a switched capacitor type circuit can be replaced by the manipulation of currents in a switched current type circuit. Just as charges can be added and subtracted on a sampled basis, so can currents be added and subtracted on a sampled basis.

From reading the present disclosure, other modifications will be apparent to persons skilled in the art. Such modifications may involve other features which are already known in the design, manufacture and use of sampled analogue electrical signal processing systems and devices and component parts thereof, may be used instead of or in addition to features already described herein without departing from the spirit and scope of the invention. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A circuit arrangement for storing sampled analogue electrical currents comprising a current input, a current output, first and second switches controlled by first and second non-overlapping clock signals, and first and second storage cells, wherein the current input is coupled to the first storage cell by means of the first switch and the first storage cell is coupled to the second storage cell by means of the second switch, an output of the second storage cell being coupled to the current output.

2. A circuit arrangement as claimed in claim 1, in which each storage cell comprises a field effect transistor having a capacitor connected between its gate and source electrodes.

3. A circuit arrangement as claimed in claim 2, in which in each storage cell the field effect transistor forms an output branch of a current mirror circuit.

4. A circuit arrangement as claimed in claim 3, in which the first and second switches are arranged to isolate the input and output branches of the current mirrors, the output branch of the first current mirror being connected to the input branch of the second current mirror.

5. A circuit arrangement as claimed in claim 4, in which at least one of the current mirror circuits has a non-unity current ratio between its input and output branches.

6. A circuit arrangement as claimed in claim 4 wherein the second current mirror has a plurality of output branches.

7. A circuit arrangement as claimed in claim 3, in which at least one of the current mirror circuits has a non-unity current ratio between its input and output branches.

8. A circuit arrangement as claimed in claim 3, wherein the second current mirror has a plurality of output branches.

9. A circuit arrangement as claimed in claim 1 wherein said first storage cell comprises a first current mirror circuit including a first FET connected as a diode and coupled to said current input, a second FET with a first capacitor coupled to a gate electrode thereof, and with said first switch coupled between a gate electrode of the first FET and said gate electrode of the second FET, and wherein said second storage cell comprises a second current mirror circuit including a third FET connected as a second diode in series with the second FET of the first current mirror circuit, and a fourth FET with a second capacitor coupled to a gate electrode thereof, and with said second switch coupled between a gate electrode of the third FET and said gate electrode of the fourth FET, and wherein said fourth FET is connected to said current output.

10. A circuit arrangement as claimed in claim 9 further comprising a fifth FET having a gate electrode connected to the gate electrode of the fourth FET and to the capacitor and an output electrode connected to said current input whereby said circuit arrangement operates as an integrator circuit to provide an output current at said current output which is the summation of currents supplied to said current input.

* * * * *